(12) United States Patent
Imade et al.

(10) Patent No.: US 7,034,407 B2
(45) Date of Patent: Apr. 25, 2006

(54) SEMICONDUCTOR DEVICE AND METHOD FOR FABRICATING THE SAME

(75) Inventors: Masahiro Imade, Osaka (JP); Tadashi Kadowaki, Osaka (JP); Hiroyuki Umimoto, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 268 days.

(21) Appl. No.: 10/601,557

(22) Filed: Jun. 24, 2003

(65) Prior Publication Data

US 2005/0087818 A1  Apr. 28, 2005

(30) Foreign Application Priority Data

Oct. 1, 2002  (JP) .............................. 2002-288528

(51) Int. Cl.
    *H01L 27/088* (2006.01)
(52) U.S. Cl. .................. 257/900; 257/369; 257/213; 438/199; 438/303
(58) Field of Classification Search ............. 257/213, 257/288, 334, 337–338, 368–369, 900, 374, 257/499; 438/184, 197, 199, 299–230, 265, 438/301, 303, 595
See application file for complete search history.

(56) References Cited

U.S. PATENT DOCUMENTS

| | | | |
|---|---|---|---|
| 6,124,189 A * | 9/2000 | Watanabe et al. | 438/586 |
| 6,303,451 B1 * | 10/2001 | Zhang et al. | 438/301 |
| 6,437,409 B1 * | 8/2002 | Fujii | 257/379 |
| 6,495,391 B1 * | 12/2002 | Chan | 438/59 |
| 6,534,840 B1 * | 3/2003 | Esaki | 257/499 |
| 6,593,197 B1 * | 7/2003 | Wieczorek et al. | 438/303 |
| 6,600,210 B1 * | 7/2003 | Kato et al. | 257/539 |
| 6,635,576 B1 * | 10/2003 | Liu et al. | 438/700 |
| 6,682,966 B1 * | 1/2004 | Iwata et al. | 438/207 |
| 6,806,537 B1 * | 10/2004 | Matsumoto et al. | 257/347 |
| 6,821,856 B1 * | 11/2004 | Takagi | 438/294 |
| 6,859,023 B1 * | 2/2005 | Yamanaka et al. | 324/71.1 |

FOREIGN PATENT DOCUMENTS

| | | |
|---|---|---|
| JP | 5-102074 | 4/1993 |
| JP | 5-211163 | 8/1993 |
| JP | 11-067904 | 3/1999 |
| JP | 2000-208625 A | 7/2000 |

* cited by examiner

*Primary Examiner*—Hoai Pham
*Assistant Examiner*—Thanh Y. Tran
(74) *Attorney, Agent, or Firm*—McDermott Will & Emery LLP

(57) ABSTRACT

A substrate 11 consists of a semiconductor layer 12 as an element formation region and an STI 13 as an isolation region. A gate dielectric 15 is provided on the semiconductor layer 12, and a gate electrode 14 is provided to extend from the top of the gate dielectric 15 to the top of the STI 13. A sidewall 30 for covering the sides of the gate electrode 14 is provided to extend across the top of the semiconductor layer 12 to the tops of regions of the STI 13 adjacent to the outer edges of the semiconductor layer 12. The sidewall 30 is employed as an ion implantation mask for forming high-concentration impurity diffusion layers 16 each serving as a source/drain region.

14 Claims, 7 Drawing Sheets

FIG. 1A
FIG. 1C
FIG. 1B
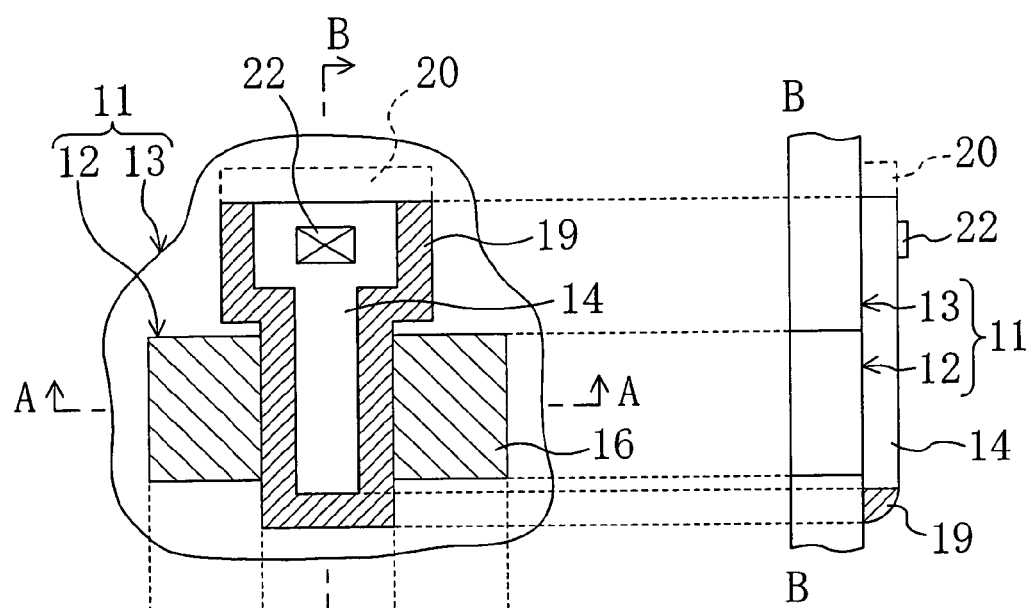
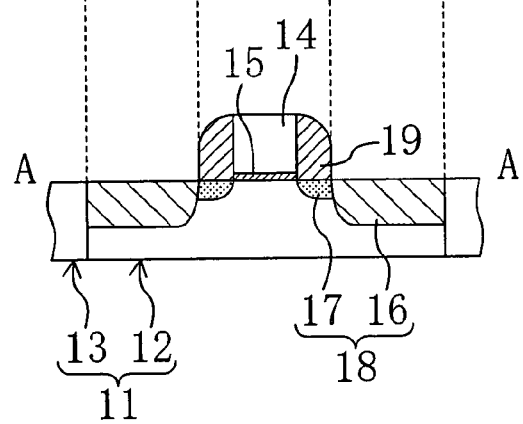

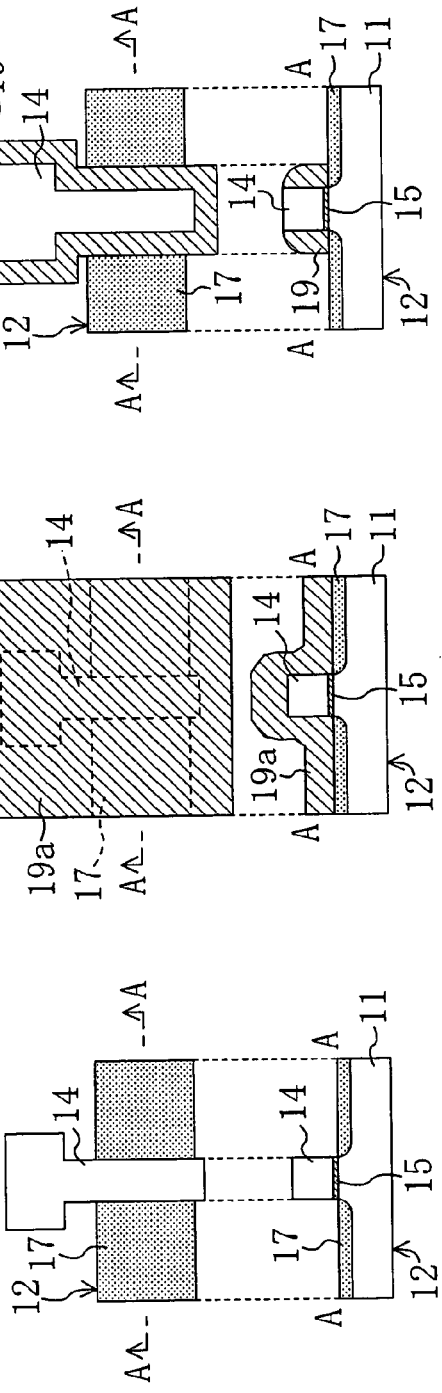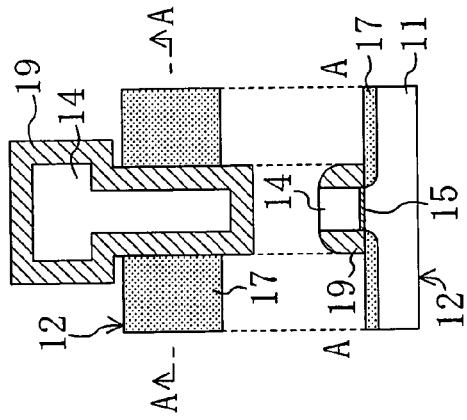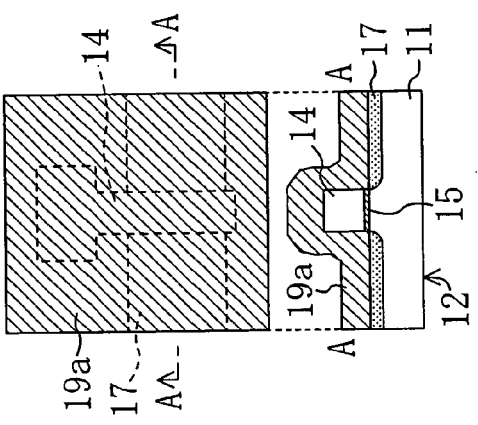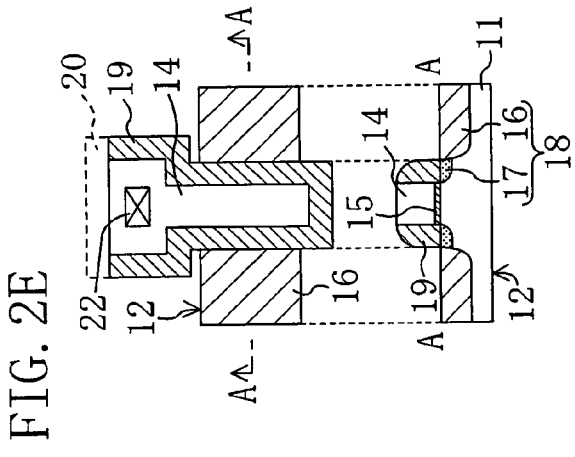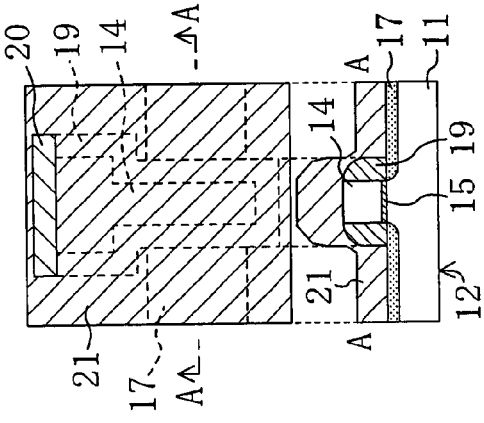

FIG. 3A
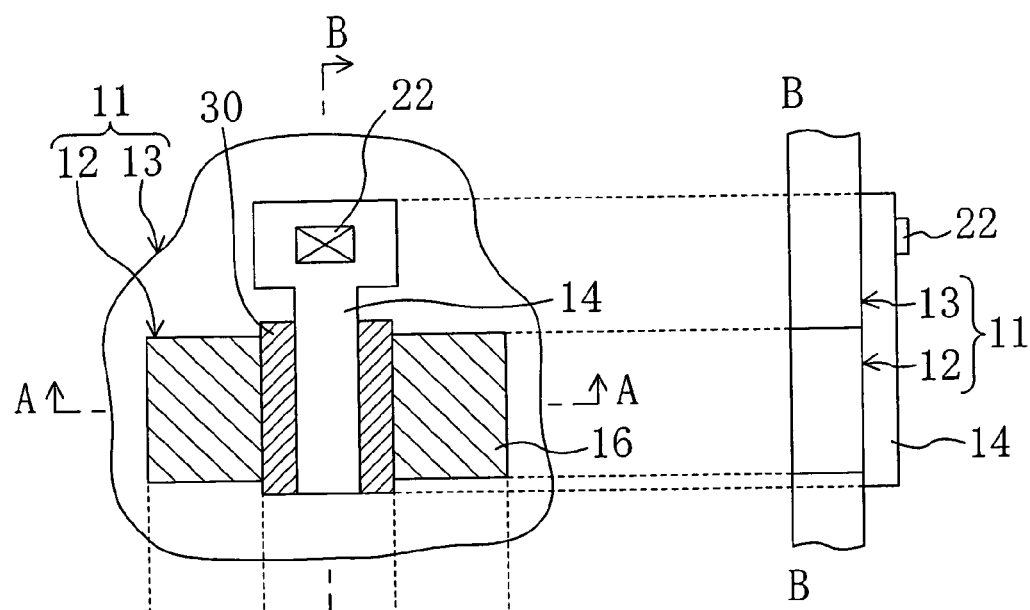
FIG. 3C
FIG. 3B
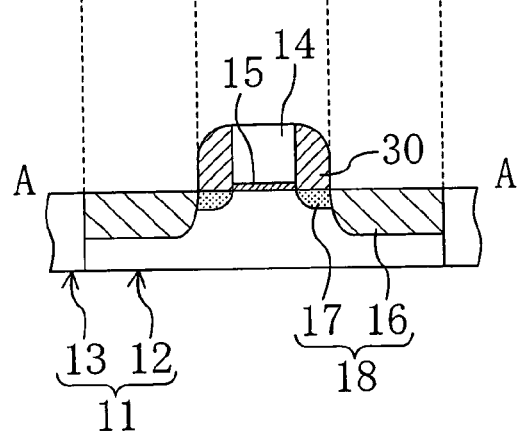

FIG. 5A
FIG. 5C
FIG. 5B
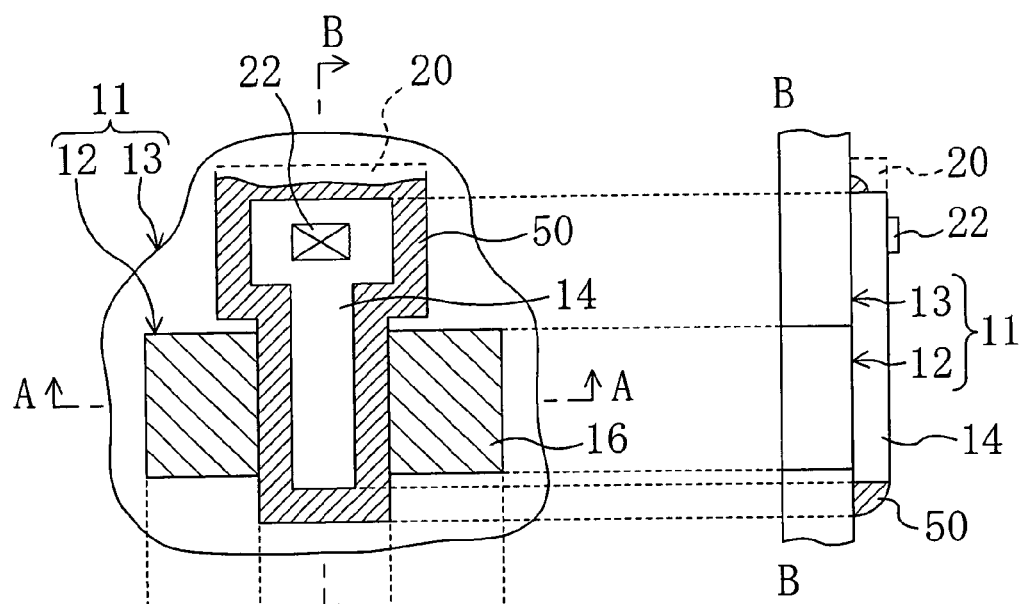
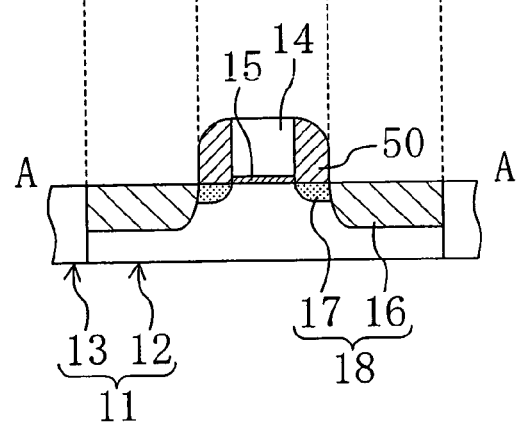

SEMICONDUCTOR DEVICE AND METHOD FOR FABRICATING THE SAME

BACKGROUND OF THE INVENTION

The present invention relates to a semiconductor device and a method for fabricating the same, and more particularly to a semiconductor device including a sidewall and a method for fabricating the same.

The structure of a known semiconductor device will be described hereinafter with reference to FIGS. 6A and 6B. FIG. 6 shows the structure of the known semiconductor device, in which FIG. 6A is a plan view, and FIG. 6B is a cross sectional view taken along the line A—A in FIG. 6A.

As shown in FIG. 6A, the known semiconductor device has a substrate 1 comprising a semiconductor layer 2 as an element formation region and a shallow trench isolation (hereinafter referred to as an STI) 3 surrounding the sides of the semiconductor layer 2. A gate electrode 4 is provided so as to extend across the top of the semiconductor layer 2 to the top of the STI 3. An insulative sidewall 9 is formed on all sides of the gate electrode 4 so as to surround them.

As shown in FIG. 6B, the known semiconductor device is formed of: the substrate 1 consisting of the semiconductor layer 2 and the STI 3; source/drain regions 8 provided apart from each other in the semiconductor layer 2 and each consisting of a high-concentration impurity diffusion layer 6 and a low-concentration impurity diffusion layer 7; a gate dielectric 5 which is provided on a region of the semiconductor layer 2 located between the source/drain regions 8 and made of a silicon oxide film ($SiO_2$); the gate electrode 4 provided on the gate dielectric 5 and made of polysilicon; and the sidewall 9 provided from the sides of the gate electrode 4 to the top of the semiconductor layer 2 and made of a silicon nitride film (SiN).

The high-concentration impurity diffusion layer 6 of each of the source/drain regions 8 is provided in a portion of the semiconductor layer 2 which is located outwardly of the insulative sidewall 9. The low-concentration impurity diffusion layer 7 borders on the inner surface of the high-concentration impurity diffusion layer 6 in the semiconductor layer 2 and is provided so as to have a smaller depth than the high-concentration impurity diffusion layer 6.

Next, a known method for fabricating a semiconductor device will be described with reference to FIGS. 7A through 7D. FIGS. 7A through 7D are cross sectional views showing process steps for fabricating the semiconductor device shown in FIG. 6.

First, in the process step shown in FIG. 7A, an STI (not shown) is formed on a substrate to surround a semiconductor layer 2, and thereafter a gate dielectric 5 made of a silicon oxide film and a gate electrode 4 made of polysilicon are formed on the semiconductor layer 2. Subsequently, ions are implanted into the semiconductor layer 2 using the gate electrode 4 as a mask, thereby forming low-concentration impurity diffusion layers 7 in portions of the upper part of the semiconductor layer 2 which are located at both sides of the gate electrode 4.

Next, in the process step shown in FIG. 7B, a silicon nitride film 9a covering the gate electrode 4 and the gate dielectric 5 is deposited on the semiconductor layer 2.

Then, in the process step shown in FIG. 7C, the silicon nitride film 9a is subjected to etchback, thereby forming a sidewall 9 on the sides of the gate electrode 4.

Next, in the process step shown in FIG. 7D, ions are implanted into the semiconductor layer 2 using the gate electrode 4 and the sidewall 9 as masks, thereby forming high-concentration impurity diffusion layers 6 in portions of the upper part of the semiconductor layer 2 which are located outwardly of the sidewall 9. Each of the high-concentration impurity diffusion layers 6 is formed so as to have a larger implantation depth than each of the low-concentration impurity diffusion layers 7. Each pair of the high-concentration impurity diffusion layer 6 and the low-concentration impurity diffusion layer 7 constitutes a source/drain region 8. Through the above-described process steps, the known semiconductor device is formed.

Typically, silicon nitride is employed as a material of the sidewall 9. Silicon nitride has a large stress. Therefore, a stress caused by the sidewall 9 is applied to the gate electrode 4, the gate dielectric 5 and the semiconductor layer 2. As a means for relaxing the stress as described above, a method for interposing an L-shaped stress-relaxation layer between the gate electrode and the sidewall has been suggested. This known art is disclosed in Japanese Unexamined Patent Publication No. 5-102074 (page 4, FIG. 4), for example.

However, with the progress of miniaturization of MISFETs (metal insulator semiconductor field effect transistors), the relative thickness of the sidewall to the gate length has been increased and the influence given to the gate electrode by the stress of the sidewall has also increased.

If the stress of the sidewall reached the gate electrode and the gate dielectric, the threshold voltage would be easily displaced. If this stress reached the semiconductor layer, crystal defects leading to the occurrence of leakage currents might take place. Therefore, it is difficult to effectively reduce the stress simply by interposing the stress-relaxation layer between the gate electrode and the sidewall, and thus further relaxation or reduction of the stress is required.

SUMMARY OF THE INVENTION

An object of the present invention is to provide a high-reliability semiconductor device and a method for fabricating the same by reducing a stress caused by a sidewall.

A first semiconductor device of the present invention comprises: a semiconductor layer including an element formation region; an isolation surrounding the sides of the element formation region; source/drain regions provided in the element formation region of the semiconductor layer; a gate dielectric provided on the element formation region; a gate electrode extending from the top of the gate dielectric to above the top of the isolation; and a sidewall provided continuously along sides of the gate electrode and discontinued at part of the sides of the gate electrode excluding part thereof located on the element formation region.

Thereby, as compared with the known art in which all the sides of the gate electrode are covered by a closed, surrounding sidewall, a stress caused by the sidewall can be reduced.

Each of the source/drain regions may include a high-concentration impurity diffusion layer and a low-concentration impurity diffusion layer, and the sidewall may be an ion implantation mask for forming the high-concentration impurity diffusion layer.

Part of the sidewall located on the isolation may be at least partly removed so that the sidewall is discontinued. Thus, stresses applied from the sidewall to the gate electrode and the gate dielectric can be decreased, thereby suppressing variations in threshold voltage.

Portions of the gate electrode provided on the isolation may include a contact formation region that constitutes a portion in contact with a gate contact and a region that is opposed to the contact formation region across the element formation region.

The sidewall may be provided only on the element formation region and boundary regions of the isolation with the element formation region. Thus, the area where a sidewall is provided can be further reduced, thereby further relaxing the stress caused by the sidewall. Accordingly, a stress applied from the sidewall to the substrate can be also decreased. Therefore, crystal defects can be prevented from occurring in the element formation region, resulting in the occurrence of leakage currents being avoided.

Between the sidewall and the gate electrode, at least one of an L-shaped sidewall and an offset spacer layer may be interposed, The sidewall is preferably made of a silicon nitride film.

A second semiconductor device of the present invention comprises: a semiconductor layer including an element formation region; an isolation surrounding the sides of the element formation region; source/drain regions provided in the element formation region of the semiconductor layer; a gate dielectric provided on the element formation region; a gate electrode extending from the top of the gate dielectric to above the top of the isolation; and a sidewall provided along sides of the gate electrode so that part of the sidewall located on part of the sides of the gate electrode excluding part thereof located on the element formation region partly becomes thinner than part of the sidewall located on the element formation region.

Thereby, as compared with the known art in which the sides of the gate electrode are surrounded by the sidewall having a uniform thickness, a stress caused by the sidewall can be reduced.

Each of the source/drain regions may include a high-concentration impurity diffusion layer and a low-concentration impurity diffusion layer, and the sidewall may be an ion implantation mask for forming the high-concentration impurity diffusion layer.

The sidewall is preferably made of a silicon nitride film.

A first method for fabricating a semiconductor device provided on a substrate including an element formation region formed of a semiconductor layer and an isolation surrounding the sides of the element formation region comprises the steps of: (a) forming a gate dielectric on the element formation region; (b) forming a gate electrode extending from the top of the gate dielectric on the element formation region to above the top of the isolation; (c) forming a sidewall surrounding the sides of the gate electrode; (d) partly removing part of the sidewall located on a surface region of the substrate excluding the element formation region to discontinue the sidewall; and (e) implanting ions using the sidewall and the gate electrode as masks after the step (c) or (d), thereby forming first impurity diffusion layers in the element formation region of the semiconductor layer.

Thereby, as compared with the known art in which all the sides of the gate electrode are covered by a closed, surrounding sidewall, a semiconductor device having a reduced stress caused by the sidewall can be fabricated.

The method may further comprise, between the step (b) and the step (c), the step of implanting ions using the gate electrode as a mask, thereby forming second impurity diffusion layers in the element formation region, wherein in the step (e), first impurity diffusion layers including a higher-concentration impurity than the second impurity diffusion layers may be formed, and each pair of the first impurity diffusion layer and the second impurity diffusion layer may constitute a source/drain region.

In the step (b), the gate electrode may be formed which includes a contact formation region and a region that is opposed to the contact formation region across the element formation region, both regions being located on the isolation, and in the step (d), the sidewall may be at least partly removed in at least one of the regions of the gate electrode located on the isolation. This makes it possible to fabricate a semiconductor device having reduced stresses applied from the sidewall to the gate electrode and the gate dielectric.

In the step (d), the sidewall may be removed excluding its portion provided on the element formation region and boundary regions of the isolation with the element formation region. This makes it possible to fabricate a semiconductor device in which the area where the sidewall is provided is further reduced. Accordingly, the stress caused by the sidewall is further reduced, and thus the stress applied from the sidewall to the substrate can be also decreased. Therefore, crystal defects can be prevented from occurring in the element formation region, resulting in the occurrence of leakage currents being avoided.

The method may further comprise, between the step (b) and the step (c), the step of forming at least one of an L-shaped sidewall and an offset spacer layer on the sides of the gate electrode.

The sidewall is preferably made of a silicon nitride film.

A second method for fabricating a semiconductor device provided on a substrate including an element formation region formed of a semiconductor layer and an isolation surrounding the sides of the element formation region comprises the steps of: (a) forming a gate dielectric on the element formation region; (b) forming a gate electrode extending from the top of the gate dielectric on the element formation region to above the top of the isolation; (c) forming a sidewall surrounding the sides of the gate electrode; (d) partly removing part of the sidewall located on a surface region of the substrate excluding the element formation region to partly reduce the thickness of the sidewall; and between the step (c) and the step (d), (e) implanting ions using the sidewall and the gate electrode as masks to form impurity diffusion layers in the element formation region.

Thereby, as compared with the known art in which sides of the gate electrode are surrounded by the sidewall having a uniform thickness, the semiconductor device having a reduced stress caused by the sidewall can be manufactured.

The sidewall is preferably-made of a silicon nitride film.

BRIEF DESCRIPTION OF THE DRAWINGS

FIGS. 1A through 1C show the structure of a semiconductor device according to a first embodiment of the present invention. FIG. 1A is a plan view, FIG. 1B is a cross sectional view taken along the line A—A of FIG. 1A extending in a gate length direction, and FIG. 1C is a cross sectional view taken along the line B—B of FIG. 1A extending in a gate width direction.

FIGS. 2A through 2E are views showing process steps for fabricating the semiconductor device according to the first embodiment. The upper of each figure is a plan view, and the lower is a cross sectional view taken along the line A—A of the upper.

FIGS. 3A through 3C show the structure of a semiconductor device according to a second embodiment of the present invention. FIG. 3A is a plan view, FIG. 3B is a cross sectional view taken along the line A—A of FIG. 3A extending in a gate length direction, and FIG. 3C is a cross sectional view taken along the line B—B of FIG. 3A extending in a gate width direction.

FIGS. 5A through 5C show the structure of a semiconductor device according to a third embodiment of the present invention. FIG. 5A is a plan view, FIG. 5B is a cross sectional view taken along the line A—A of FIG. 5A extending in a gate length direction, and FIG. 5C is a cross sectional view taken along the line B—B of FIG. 5A extending in a gate width direction.

FIG. 6A is a plan view, and FIG. 6B is a cross sectional view taken along the line A—A of FIG. 6A.

DESCRIPTION OF THE PREFERRED EMBODIMENTS

Figure 4A:
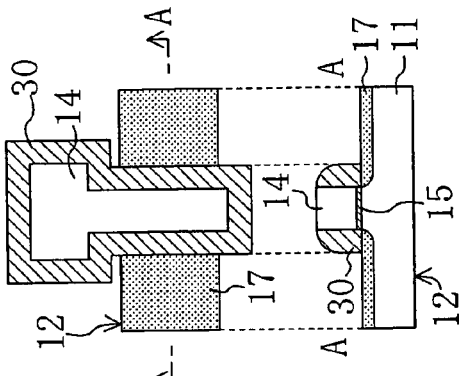
FIG. 4A through 4E are views showing process steps for fabricating the semiconductor device according to the second embodiment. The upper of each figure is a plan view, and the lower is a cross sectional view taken along the line A—A of the upper.

Embodiments of the present invention will be described hereinafter with reference to the drawings.

Although description is directed to a MISFET having a lightly doped drain (LDD) structure in the below embodiments, the present invention is not restricted thereto. The present invention can be applied to various types of semiconductor devices including a sidewall or a corresponding structure and having a stress caused by the sidewall or the structure as a problem.

Embodiment 1

First, a semiconductor device according to a first embodiment of the present invention will be described with reference to FIGS. 1A through 1C. FIG. 1 shows the structure of the semiconductor device according to the first embodiment. FIG. 1A is a plan view, FIG. 1B is a cross sectional view taken along the line A—A of FIG. 1A extending in a gate length direction, and FIG. 1C is a cross sectional view taken along the line B—B of FIG. 1A extending in a gate width direction.

As shown in FIG. 1A, the semiconductor device according to this embodiment has a substrate 11 comprising a semiconductor layer 12 as an element formation region and a shallow trench isolation (hereinafter referred to as an STI) 13 surrounding the sides of the semiconductor layer 12. A gate electrode 14 is provided so as to extend across the top of the semiconductor layer 12 to the top of the STI 13. The sides of the gate electrode 14 are surrounded by an insulative sidewall 19 with exception of a region 20 located on the STI 13 and laterally of a gate contact 22. Thus, since the sidewall 19 is not provided in the region 20 as also shown in FIG. 1C, the side surface of the gate electrode 14 is exposed above the STI 13.

As shown in FIG. 1B, the semiconductor device according to this embodiment is formed of: the substrate 11 including the semiconductor layer 12 constituting an element formation region and the STI 13 constituting an isolation region; source/drain regions 18 provided in the semiconductor layer 12 and each consisting, of a high-concentration impurity diffusion layer 16 and a low-concentration impurity diffusion layer 17; a gate dielectric 15 which is provided on a region of the semiconductor layer 12 located between the source/drain regions 18 and made of a silicon oxide film or a silicon oxynitride film; the gate electrode 14 of polysilicon which is provided on the gate dielectric 15 and has a gate length of 130 nm; and the insulative sidewall 19 provided on sides of the gate electrode 14.

The source/drain regions 18 are provided apart from each other in the semiconductor layer 12. Each of the high-concentration impurity diffusion layers 16 contains an impurity having a concentration of $1 \times 10^{21}/cm^3$. Each of the low-concentration impurity diffusion layers 17 is provided so as to have a smaller depth than the high-concentration impurity diffusion layer 16 and contains an impurity having a concentration of $1 \times 10^{18}/cm^3$ to $6 \times 10^{20}/cm^3$.

Next, a method for fabricating a semiconductor device according to the first embodiment will be described with reference to FIGS. 2A through 2E. FIGS. 2A through 2E are views showing process steps for fabricating the semiconductor device according to the first embodiment. The upper of each figure is a plan view, and the lower of each figure is a cross sectional view taken along the line A—A of the upper.

First, in the process step shown in FIG. 2A, a trench (not shown) is formed in a region of the substrate 11 surrounding the sides of the element formation region. The trench is filled with the silicon oxide film, thereby forming an STI 13 (as shown in FIGS. 1A to 1C). Thus, the semiconductor layer 12 as the element formation region and the STI 13 surrounding the sides of the semiconductor layer 12 are exposed at the upper surface of the substrate.

Next, a gate dielectric 15 made of a silicon oxide film or a silicon oxynitride film is formed on the semiconductor layer 12, and thereafter a gate electrode 14 made of polysilicon is formed on the gate dielectric 15. At this time, the gate electrode 14 is formed so as to extend across the top of the semiconductor layer 12 to the top of the STI 13.

Then, impurity ions are implanted into the semiconductor layer 12 using the gate electrode 14 as a mask, thereby forming low-concentration impurity diffusion layers 17 each having an impurity concentration of $1 \times 10^{18}/cm^3$ to $6 \times 10^{20}/cm^3$.

Next, in the process step shown in FIG. 2B, a sidewall dielectric 19a is deposited on the semiconductor layer 12 to cover the gate electrode 14 and the gate dielectric 15. Here, a silicon nitride film is taken as an example of the sidewall dielectric 19a. However, a laminated film made of a silicon oxide film (lower layer) and a silicon nitride film (upper layer) may be employed. Alternatively, a laminated film made of a silicon oxynitride film or a silicon oxide film (lower layer) and a silicon oxynitride film (upper layer) may be employed.

Next, in the process step shown in FIG. 2C, the sidewall dielectric 19a is subjected to anisotropic etchback by dry etching, thereby forming a sidewall 19 surrounding the sides of the gate electrode 14.

Next, in the process step shown in FIG. 2D, a photoresist layer 21 is formed on the substrate 11 by lithography to have an opening above a region 20 of the sidewall 19 located laterally of a part of the gate electrode 14 in which a gate contact 22 (shown in FIG. 2E) is to be provided.

Next, in the process step shown in FIG. 2E, etching is performed using the photoresist layer 21 as a mask, thereby removing the region 20 of the sidewall 19, which is located on the STI 13. This etching can be either anisotropic or isotropic. In the case of an anisotropic etching process, dry etching is performed by employing $CHF_3$ gas. In the case of an isotropic etching process, dry etching is performed by employing $CF_4$ gas. Then, the photoresist layer 21 remaining on the substrate is removed.

Thereafter, impurity ions are implanted using the gate electrode 14 and the sidewall 19 as masks, thereby forming high-concentration impurity diffusion layers 16 each having an impurity concentration of $1\times10^{21}/cm^3$ in the semiconductor layer 12. Then, an interlevel dielectric (not shown) is formed on the substrate 11, and a gate contact 22 connected to the gate electrode 14 and source/drain contacts (not shown) connected to the corresponding high-concentration impurity diffusion layers 16 are formed. In this manner, a semiconductor device having an LDD structure is formed.

According to the semiconductor device of this embodiment, as shown in FIG. 1A, the sidewall 19 is not formed in the region 20 located on one of the sides of the gate electrode 14. Therefore, as compared with the known art in which all the sides of the gate electrode are covered by the sidewall, stresses applied to the gate electrode 14 and the gate dielectric 15 can be decreased. Accordingly, variations in threshold voltage are suppressed. Therefore, further element miniaturization also becomes possible.

Since the region 20 is apart from the semiconductor layer 12 as the element formation region, it is also advantageous that mask alignment for removing the sidewall 19 becomes easier.

Although in this embodiment the removed portion of the sidewall 19 is the region 20 located laterally of a portion of the gate electrode 14 in which the gate contact 22 is to be provided, the present invention is not restricted thereto. Any portion of the sidewall that is located on the STI 13 may be removed. For example, a region of the sidewall 19 opposed to the region 20 across the semiconductor layer 12 may be removed.

This embodiment describes the case where the sidewall 19 is provided on the sides of the gate electrode 14 and on the top of the substrate 11. In the present invention, however, an L-shaped sidewall, an offset spacer layer or the like may be interposed between each of the gate electrode 14 and the substrate 11 and the sidewall 19. Here, the L-shaped sidewall is formed to extend from the sides of the gate electrode to the top of the semiconductor layer and come into contact with the semiconductor layer, for the purpose of relaxing stresses given to the gate electrode and the semiconductor layer by the stress of the sidewall. The offset spacer layer is provided on the sides of the gate electrode for the purpose, of adjusting an overlap between the gate electrode and each of the low-concentration impurity diffusion layers.

Although in this embodiment a bulk silicon substrate is employed as a substrate, a silicon-on-insulator (SOI) substrate can be employed instead in the present invention.

Embodiment 2

Next, a semiconductor device according to a second embodiment of the present invention will be described with reference to FIGS. 3A through 3C. FIG. 3 shows the structure of the semiconductor device according to the second embodiment. FIG. 3A is a plan view, FIG. 3B is a cross sectional view taken along the line A—A of FIG. 3A extending in a gate length direction, and FIG. 3C is a cross sectional view taken along the line B—B of FIG. 3A extending in a gate width direction. This embodiment will be described by employing the same numerals for components similar to those of the first embodiment.

As shown in FIG. 3A, in the semiconductor device of this embodiment, an insulative sidewall 30 is formed only in regions required for ion implantation into the high-concentration impurity diffusion layers 16. That is, the sidewall 30 is formed to extend from the top of the semiconductor layer 12 to the tops of portions of the STI 13 which are adjacent to the outer edges of the semiconductor layer 12. The other structures are similar to those of the first embodiment, and therefore a description thereof is omitted.

Next, a method for fabricating a semiconductor device of this embodiment will be described with reference to FIGS. 4A through 4E. FIGS. 4A through 4E are views showing process steps for fabricating a semiconductor device according to the second embodiment. The upper of each figure is a plan view, and the lower is a cross sectional view taken along the line A—A of the upper.

First, in the process step shown in FIG. 4A, a trench (not shown) is formed in a region of the substrate 11 surrounding the sides of the element formation region. The trench is filled with the silicon oxide film, thereby forming an STI 13 (shown in FIGS. 3A to 3C). Thus, the semiconductor layer 12 as the element formation region and the STI 13 surrounding the sides of the semiconductor layer 12 are exposed at the upper surface of the substrate.

Next, a gate dielectric 15 made of a silicon oxide film or a silicon oxynitride film is formed on the semiconductor layer 12, and thereafter a gate electrode 14 made of polysilicon is formed on the gate dielectric 15. At this time, the gate electrode 14 is formed so as to extend across the top of the semiconductor layer 12 to the top of the STI 13.

Then, impurity ions are implanted into the semiconductor layer 12 using the gate electrode 14 as a mask, thereby forming low-concentration impurity diffusion layers 17 each having an impurity concentration of $1\times10^{18}/cm^3$ to $6\times10^{20}/cm^3$.

Figure 4B:
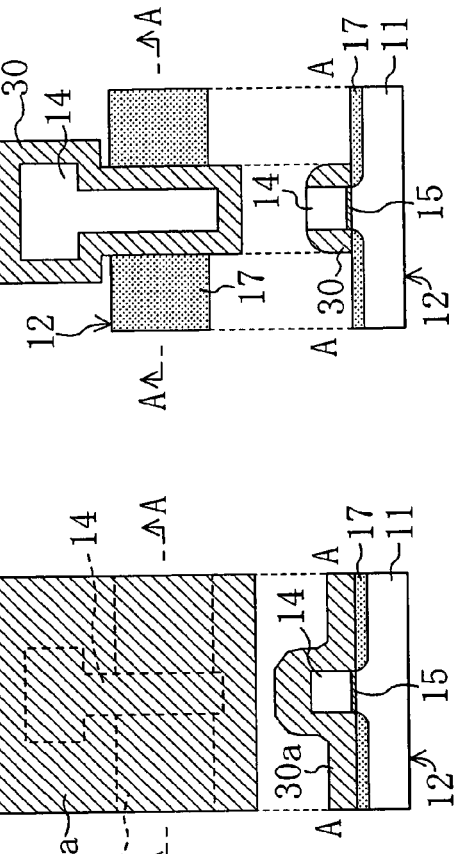

Next, in the process step shown in FIG. 4B, a sidewall dielectric 30a is deposited on the semiconductor layer 12 to cover the gate electrode 14 and the gate dielectric 15. Here, a silicon nitride film is taken as an example of the sidewall dielectric 30a.

Figure 4C:
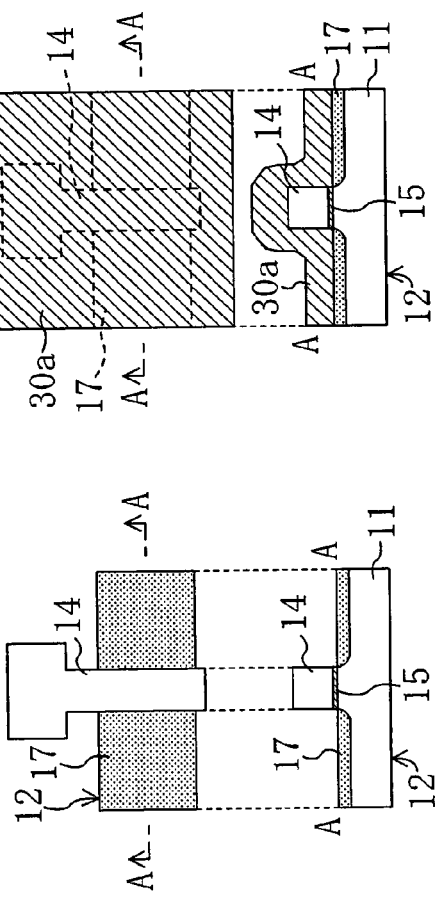

Next, in the process step shown in FIG. 4C, the sidewall dielectric 30a is subjected to anisotropic etchback by drying etching, thereby forming a sidewall 30 surrounding the sides of the gate electrode 14.

Figure 4D:
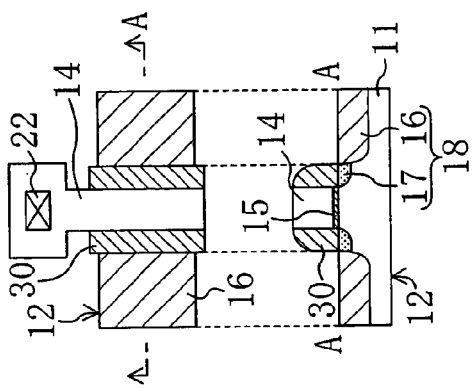

Next, in the process step shown in FIG. 4D, by employing a lithography technique, the substrate is covered by a photoresist layer 33, and only portions of the photoresist layer 33 that are located in regions 31 and 32 are removed to form openings. The regions 31 and 32 are both located on the STI 13. The region 31 is one located laterally of a portion of the gate electrode 14 in which a gate contact 22 (shown in FIG. 4E) is to be provided. The region 32 is one located opposite in the gate width direction to the region 31 across the semiconductor layer 12.

As described above, after depositing the photoresist layer 33 on the whole substrate, the portions of the photoresist layer located in the regions 31 and 32 may be removed, or portions thereof other than a portion covering the semiconductor layer 12 may be removed. In the latter case, the etching of the sidewall 30 is performed with the STI 13 exposed at the sides of the sidewall 30. Since the STI 13 and the sidewall 30 are usually made of different materials, a selective etching process of the sidewall 30 is possible without significantly affecting the STI 13.

Figure 4E:
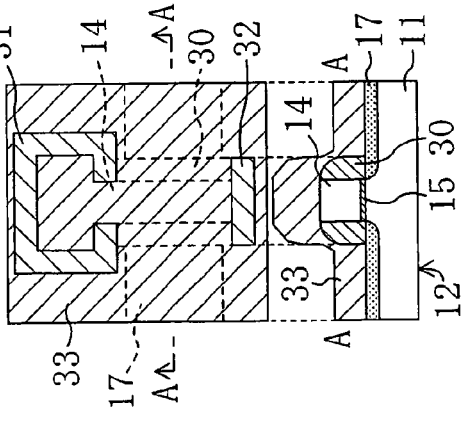
Figure 6A:
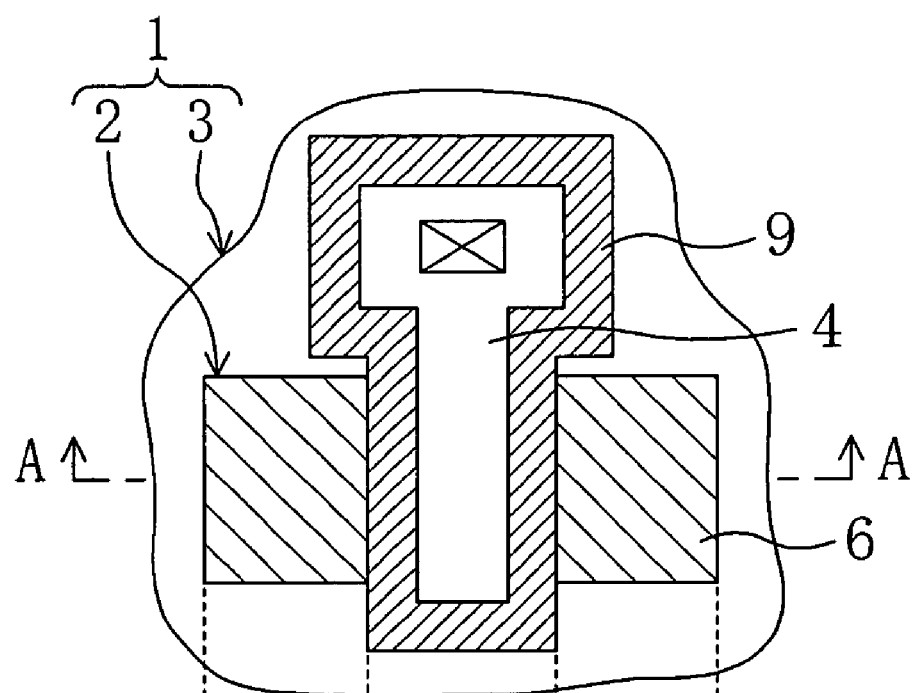
FIGS. 6A and 6B show the structure of a known semiconductor device.
Figure 6B:
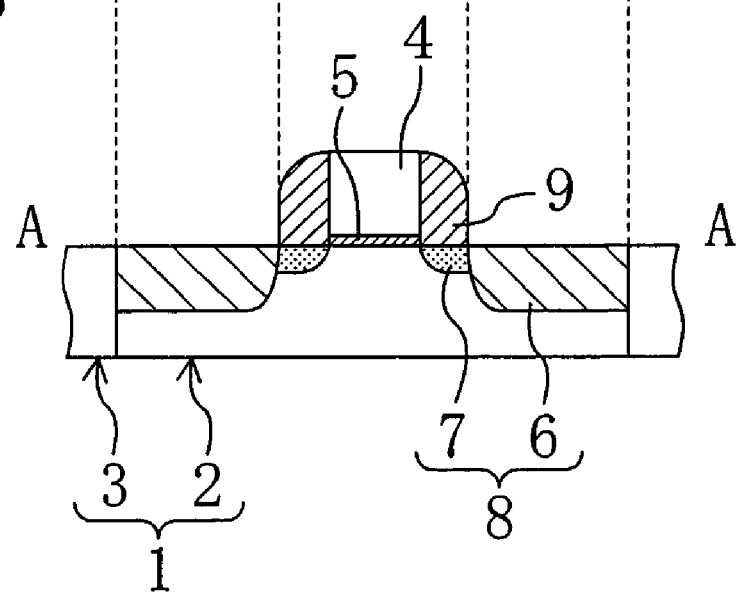
Figure 7A:
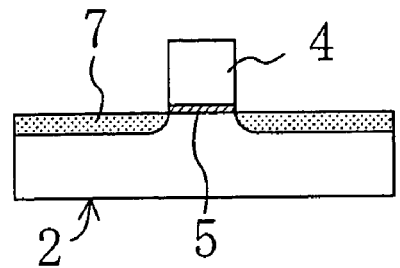
FIGS. 7A through 7D are cross sectional views showing process steps for fabricating the semiconductor device shown in FIG. 6.
Figure 7B:
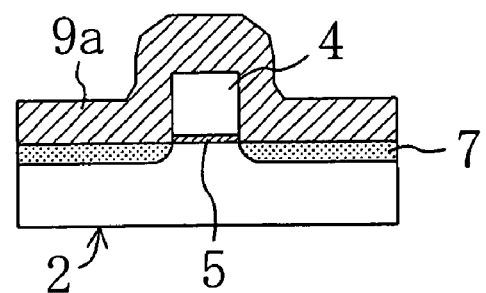
Figure 7C:
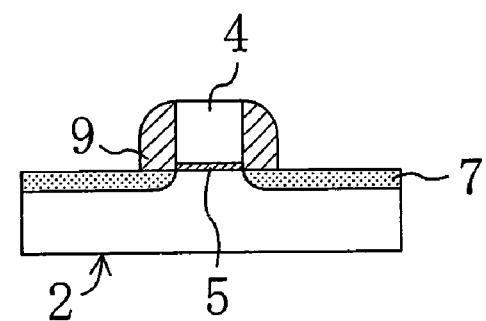
Figure 7D:
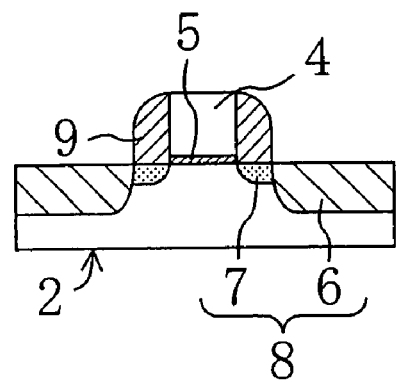

Next, in the process step shown in FIG. 4E, etching is performed using the photoresist layer 33 as a mask, thereby removing the regions 31 and 32 of the sidewall 30, which are located on the STI 13. This etching can be either anisotropic or isotropic. In the case of an anisotropic etching process, dry etching is performed by employing $CHF_3$ gas. In the case of an isotropic etching process, dry etching is performed by employing $CF_4$ gas. Then, the photoresist layer 33 is removed.

Thereafter, impurity ions are implanted using the gate electrode 14 and the sidewall 30 as masks, thereby forming high-concentration impurity diffusion layers 16 each having an impurity concentration of $1 \times 10^{21}/cm^3$ in the semiconductor layer 12. Then, an interlevel dielectric (not shown) is formed on the substrate, and thereafter a gate contact 22 connected to the gate electrode 14 and the source/drain contacts (not shown) connected to the corresponding high-concentration impurity diffusion layers 16 are formed. In this manner, a semiconductor device having an LDD structure is formed.

According to the semiconductor device of this embodiment, the sidewall 30 is not formed, among regions located laterally of the gate electrode 14, in the regions 31 and 32 located on the STI 13. Therefore, the sidewall 30 is formed only on the top of the semiconductor layer 12 and portions of the STI 13 adjacent to the outer edges of the semiconductor layer 12. At this time, the portion of STI 13 adjacent to each of the outer edges of the semiconductor layer 12 need only be formed to the extent that deviation caused by mask alignment and the etching process of the sidewall 30 do not cause the semiconductor layer 12 to be exposed. Therefore, as compared with the known art in which all the sides of the gate electrode are covered by the sidewall, stresses applied to the gate electrode 14 or the gate dielectric 15 can be reduced. Accordingly, variations in threshold voltage are suppressed. Therefore, further element miniaturization also becomes possible.

As compared with the first embodiment, the area where the sidewall is provided further becomes smaller. Therefore, the stress caused by the sidewall is further relaxed, and thus the stress applied from the sidewall to the substrate 11 is also suppressed. Accordingly, it becomes difficult for crystal defects to occur in the semiconductor layer 2. This avoids the occurrence of leakage currents, resulting in enhanced reliability.

This embodiment describes the case where the sidewall 30 is provided on the sides of the gate electrode 14 and on the top of the substrate 11. In the present invention, however, an L-shaped sidewall, an offset spacer layer or the like may be interposed between each of the gate electrode 14 and the substrate 11 and the sidewall 30.

Although in this embodiment a bulk silicon substrate is employed as a substrate, an SOI substrate can be employed instead in the present invention.

Embodiment 3

The above-mentioned two embodiments disclose the case where the sidewall is discontinued at a side or sides of the gate electrode. However, even when the sidewall is not discontinued but partly made thinner at that portion, the stress caused by the sidewall can be reduced. This embodiment describes a specific example concerning such a case.

FIG. 5 shows the structure of the semiconductor device according to a third embodiment of the present invention. FIG. 5A is a plan view, FIG. 5B is a cross sectional view taken along the line A—A of FIG. 5A extending in a gate length direction, and FIG. 5C is a cross sectional view taken along the line B—B of FIG. 5A extending in a gate width direction. As shown in FIGS. 5A and 5C, the semiconductor device of this embodiment is different from that of the first embodiment in that a region 20 of a sidewall 50 is not completely removed but remains with a thinner thickness than the other regions of the sidewall 50.

Here, when a portion of the sidewall 50 located in the region 20 is removed, the vertical thickness mainly becomes thinner at anisotropic etching while the vertical and horizontal thicknesses become thinner at isotropic etching. The other structures are similar to those of the first embodiment.

Although FIGS. 5A through 5C illustrate the case where the sidewall 50 becomes thinner in the region 20, the sidewall may become thinner in the regions 31 and 32 shown in FIG. 4D of the second embodiment.

Although in this embodiment a bulk silicon substrate is employed as a substrate, an SOI substrate can be employed instead in the present invention.

The present invention can reduce stresses applied from the sidewall to the gate electrode and the gate dielectric as compared with the known art. Therefore, variations in threshold voltage can be suppressed, thereby suppressing the occurrence of the crystal defects.

What is claimed is:

1. A semiconductor device comprising:
   a semiconductor layer including an element formation region;
   an isolation surrounding the sides of the element formation region;
   source/drain regions provided in the element formation region of the semiconductor layer;
   a gate dielectric provided on the element formation region;
   a gate electrode extending from the top of the gate dielectric to above the top of the isolation; and
   a sidewall made of a dielectric, provided continuously along sides of the gate electrode and discontinued at part of the sides of the gate electrode excluding part thereof located on the element formation region,
   wherein the sidewall is formed by subjecting the dielectric to etchback until an upper surface of the gate electrode is exposed.

2. The semiconductor device of claim 1, wherein
   each of the source/drain regions includes a high-concentration impurity diffusion layer and a low-concentration impurity diffusion layer, and
   the sidewall is an ion implantation mask for forming the high-concentration impurity diffusion layer.

3. The semiconductor device of claim 1, wherein
   part of the sidewall located on the isolation is at least partly removed so that the sidewall is discontinued.

4. The semiconductor device of claim 1, wherein
   portions of the gate electrode provided on the isolation include a contact formation region that constitutes a portion in contact with a gate contact and a region that is opposed to the contact formation region across the element formation region.

5. The semiconductor device of claim 1, wherein
   the sidewall is provided only on the element formation region and boundary regions of the isolation with the element formation region.

6. The semiconductor device of claim 1, wherein
   between the sidewall and the gate electrode, at least one of an L-shaped sidewall and an offset spacer layer is interposed.

7. The semiconductor device of claim 1, wherein the dielectric sidewall is made of a silicon nitride film.

8. A method for fabricating a semiconductor device provided on a substrate including an element formation region formed of a semiconductor layer and an isolation surrounding the sides of the element formation region, said method comprising the steps of:
(a) forming a gate dielectric on the element formation region;
(b) forming a gate electrode extending from the top of the gate dielectric on the element formation region to above the top of the isolation;
(c) forming a dielectric on the substrate after the step (b);
(d) forming a sidewall surrounding the sides of the gate electrode by subjecting the dielectric to etchback until an upper surface of the gate electrode is exposed; and
(e) partly removing part of the sidewall located on a surface region of the substrate excluding the element formation region to discontinue the sidewall.

9. The method for fabricating a semiconductor device of claim 8, wherein
in the step (b), the gate electrode is formed which includes a contact formation region and a region that is opposed to the contact formation region across the element formation region, both regions being located on the isolation, and
in the step (e), the sidewall is at least partly removed in at least one of the regions of the gate electrode located on the isolation.

10. The method for fabricating a semiconductor device of claim 8, wherein in the step (e), the sidewall is removed excluding its portions provided on the element formation region and boundary regions of the isolation with the element formation region.

11. The method for fabricating a semiconductor device of claim 8, said method further comprising, between the step (b) and the step (d), the step of forming at least one of an L-shaped sidewall and an offset spacer layer on the sides of the gate electrode.

12. The method for fabricating a semiconductor device of claim 8 wherein the dielectric is made of a silicon nitride film.

13. The method for fabricating a semiconductor device of claim 8, said method further comprising step (f) of implanting ions using the sidewall and the gate electrode as masks after step (d) or (e), thereby forming first impurity diffusion layers in the element formation region of the semiconductor layer.

14. The method for fabricating a semiconductor device of claim 13, said method further comprising, between the step (b) and the step (c), the step of implanting ions using the gate electrode as a mask, thereby forming second impurity diffusion layers in the element formation region,
wherein in the step (f), first impurity diffusion layers including a higher-concentration impurity than the second impurity diffusion layers are formed, and each pair of the first impurity diffusion layer and the second impurity diffusion layer constitutes a source/drain region.

* * * * *